(12) United States Patent
Worton

(10) Patent No.: US 10,781,585 B2
(45) Date of Patent: Sep. 22, 2020

(54) REMOVABLE WALL PANEL FOR PORTABLE ELECTRICAL BUILDINGS

(71) Applicant: Quality Electrical Systems, Inc., West Jordan, UT (US)

(72) Inventor: Kenneth DeWayne Worton, West Jordan, UT (US)

(73) Assignee: QUALITY ELECTRICAL SYSTEMS, INC., West Jordan, UT (US)

( * ) Notice: Subject to any disclaimer, the term of this patent is extended or adjusted under 35 U.S.C. 154(b) by 0 days.

(21) Appl. No.: 16/005,511

(22) Filed: Jun. 11, 2018

(65) Prior Publication Data

US 2019/0376288 A1 Dec. 12, 2019

(51) Int. Cl.
*E04B 1/343* (2006.01)
*E04B 2/00* (2006.01)
(Continued)

(52) U.S. Cl.
CPC ...... *E04B 1/34321* (2013.01); *E04B 1/34384* (2013.01); *E04C 2/38* (2013.01);
(Continued)

(58) Field of Classification Search
CPC ..... E04C 2/46; E04C 2/40; E04C 2/38; E04C 2/425; E04H 1/1205; E04H 1/005; E04B 1/34321; E04B 1/34384; H05K 7/1497
See application file for complete search history.

(56) References Cited

U.S. PATENT DOCUMENTS

| | | | |
|---|---|---|---|
| 3,608,258 A | 9/1971 | Spratt | |
| 3,744,199 A | 7/1973 | Navarre | |

(Continued)

FOREIGN PATENT DOCUMENTS

| | | |
|---|---|---|
| CA | 1332864 | 11/1994 |
| EP | 2101017 | 9/2009 |

(Continued)

OTHER PUBLICATIONS

Almac Metal Industries Ltd. Website www.almacmetal.com/our-products.html at least as early as Apr. 12, 2018.

(Continued)

*Primary Examiner* — Jessie T Fonseca
(74) *Attorney, Agent, or Firm* — Morriss O'Bryant Compagni Cannon, PLLC

(57) ABSTRACT

A portable building is disclosed, having a wall section including a first upwardly extending support member, a second upwardly extending support member and a header supported by the first upwardly extending support member and the second upwardly extending support member, the header having a header channel. The wall section also includes a floor beam secured to the first upwardly extending support member and the second upwardly extending support member, the floor beam having a floor beam channel. Further, the wall section includes a plurality of wall panels, where each of the plurality of wall panels are removably retained within the header channel and the floor beam channel, such that each of the plurality of wall panels are slidable along the floor beam and the header while retained within the header channel and the floor beam channel. Each of the plurality of wall panels are configured to interlockingly engage an immediately adjacent wall panel and an exterior surface of each of the plurality of wall panels form a continuous exterior wall surface.

1 Claim, 8 Drawing Sheets

(51) Int. Cl.
*E04H 1/00* (2006.01)
*E04C 2/42* (2006.01)
*E04C 2/38* (2006.01)
*E04H 1/12* (2006.01)
*E04C 2/40* (2006.01)
*H05K 7/14* (2006.01)
*E04C 2/00* (2006.01)

(52) U.S. Cl.
CPC ............... *E04C 2/40* (2013.01); *E04C 2/425* (2013.01); *E04C 2/46* (2013.01); *E04H 1/005* (2013.01); *E04H 1/1205* (2013.01); *E04C 2002/004* (2013.01); *H05K 7/1497* (2013.01)

(56) References Cited

U.S. PATENT DOCUMENTS

| | | | |
|---|---|---|---|
| 3,828,502 A * | 8/1974 | Carlsson | E04B 1/14 52/125.4 |
| 4,406,439 A * | 9/1983 | Garter | E04H 4/0081 249/10 |
| 4,769,963 A | 9/1988 | Meyerson | |
| 4,857,184 A | 8/1989 | DeLoach | |
| 5,204,149 A * | 4/1993 | Phenicie | B65D 90/026 220/1.5 |
| 5,822,940 A | 10/1998 | Carlin et al. | |
| 5,839,249 A * | 11/1998 | Roberts | E04B 1/14 52/745.08 |
| 6,298,619 B1 * | 10/2001 | Davie | E04B 1/14 52/220.7 |
| 6,834,468 B1 | 12/2004 | Kroie | |
| 8,033,065 B2 | 10/2011 | Paetkau et al. | |
| 8,065,846 B2 | 11/2011 | McDonald et al. | |
| 8,146,314 B2 | 4/2012 | Nguyen | |
| 8,353,131 B2 | 1/2013 | Freet | |
| 8,769,898 B2 | 7/2014 | Carolan et al. | |
| 8,769,904 B1 | 7/2014 | Brandt et al. | |
| 8,869,492 B2 | 10/2014 | Leahy | |
| 8,950,132 B2 | 2/2015 | Collins et al. | |
| 8,973,337 B2 | 3/2015 | Hires et al. | |
| 9,624,712 B2 | 4/2017 | Bottin | |
| 2006/0048459 A1 | 3/2006 | Moore | |
| 2007/0094963 A1 * | 5/2007 | McDonald | E04C 2/384 52/270 |
| 2008/0209827 A1 * | 9/2008 | Webb | E04B 2/821 52/220.7 |
| 2011/0189936 A1 | 8/2011 | Haspers et al. | |
| 2019/0010692 A1 * | 1/2019 | Segall | E04C 2/30 |

FOREIGN PATENT DOCUMENTS

| | | |
|---|---|---|
| JP | 2008095279 | 4/2008 |
| KR | 20020036690 | 5/2002 |
| WO | WO9401647 | 1/1994 |

OTHER PUBLICATIONS

Koontz-Wagner PCH Packaged Control Buildings, Generator Enclosures and Base Tanks brochure p. 1-12, at least as early as 2013.

* cited by examiner

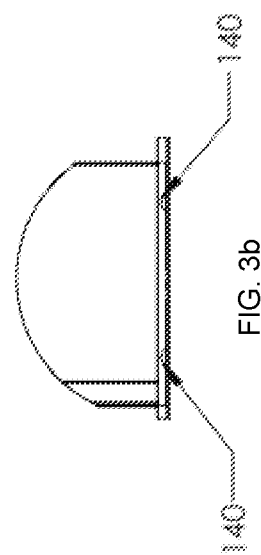
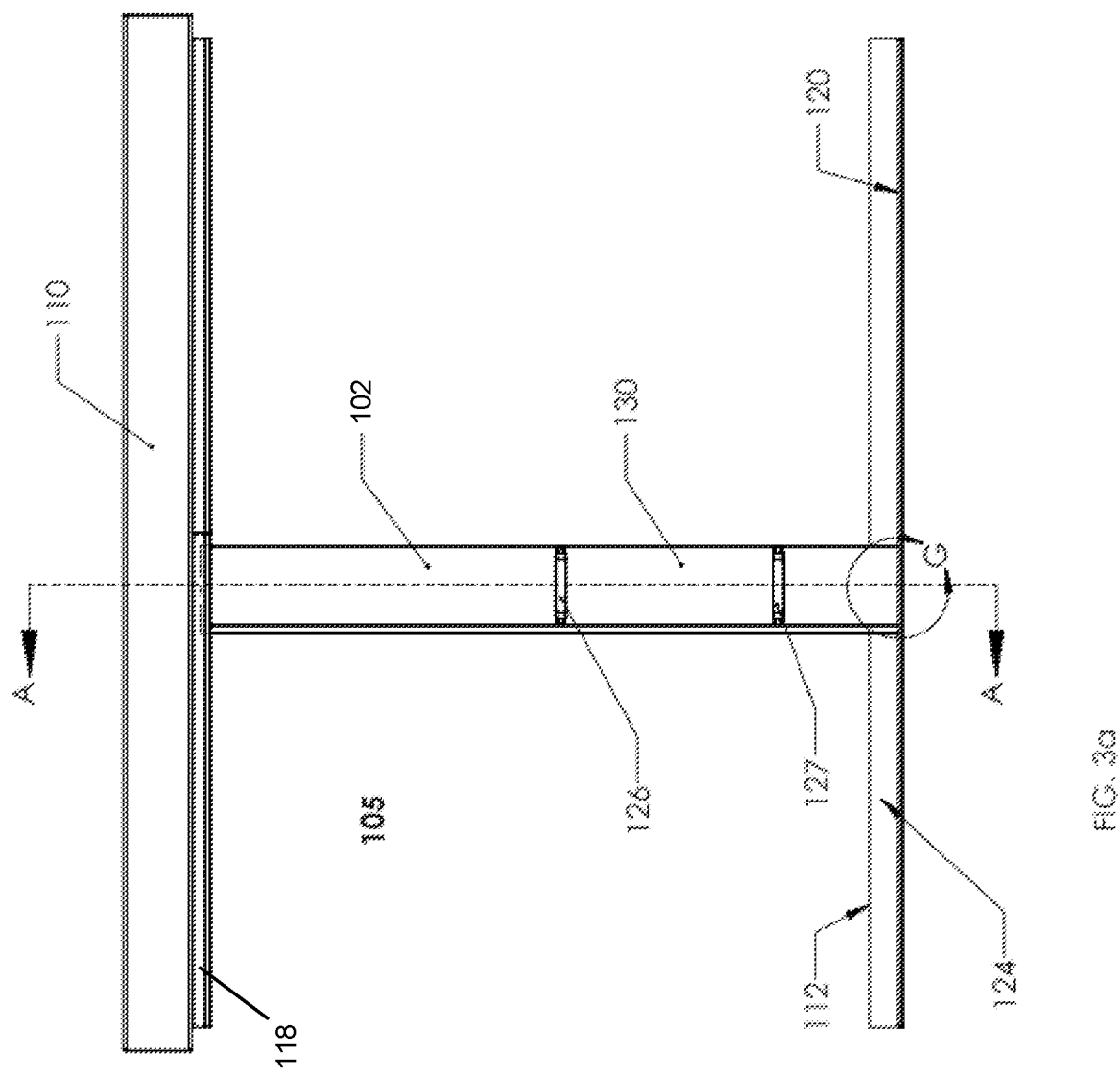

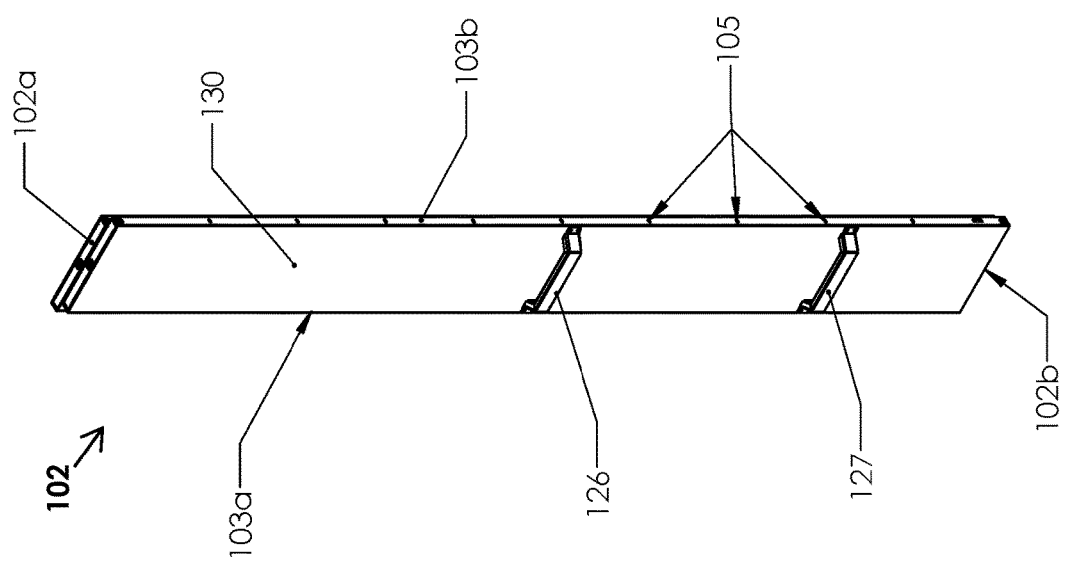

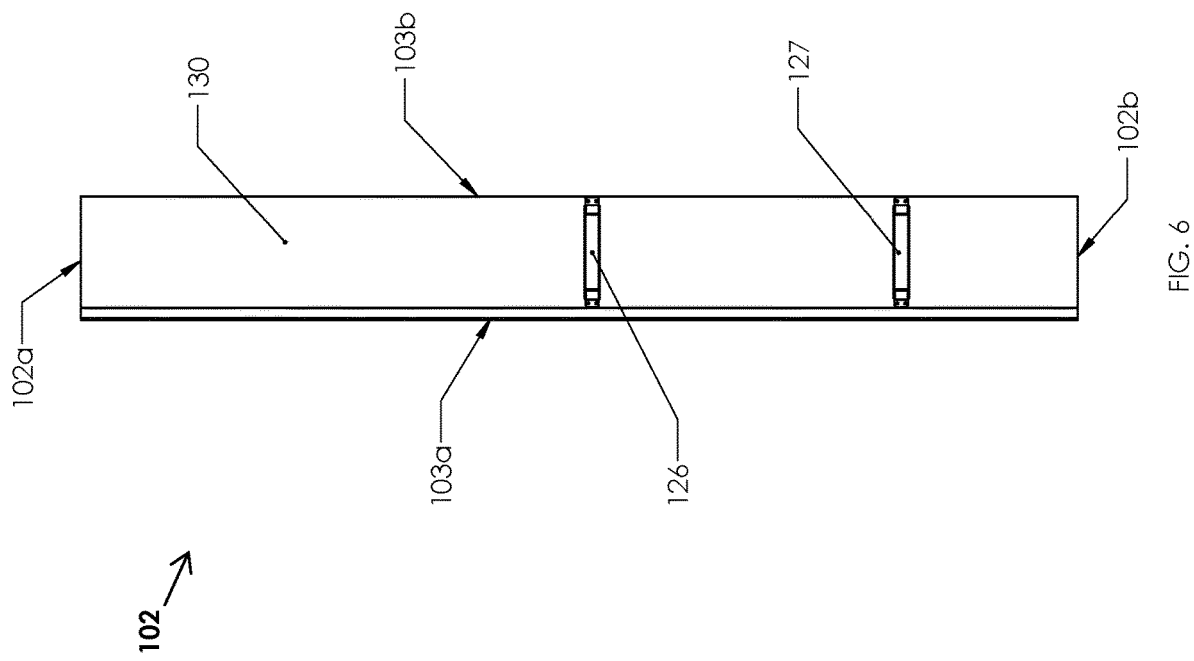

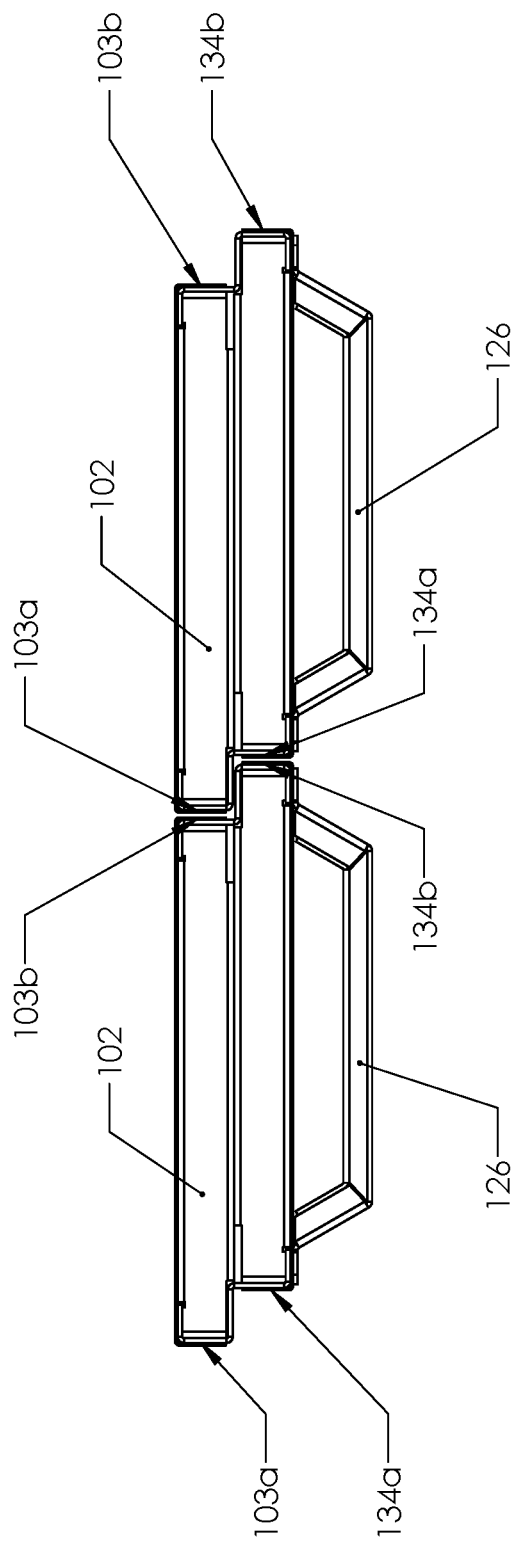

REMOVABLE WALL PANEL FOR PORTABLE ELECTRICAL BUILDINGS

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND

1. The Field of the Present Disclosure

The present disclosure relates generally to portable buildings, and more particularly, but not necessarily entirely, to portable buildings used to house electrical components or systems, having removable wall panels.

2. Description of Related Art

It is common practice to provide portable buildings, providing a less expensive and easy set up, than a permanent building. Portably buildings can be cost effective and useful on constructions sites or other locations where a build or shelter is necessary, but perhaps only for a limited amount of time. Additionally, portable buildings typically do not require substantial foundations or rough-in utilities, and can therefore, provide additional square footage for storage or other uses, at a reduced cost.

Portable buildings can also be effective when timing is a premium and a building or storage facility is need very quickly. Most conventional portable building can be set up fairly quickly, especially when compared to permanent-type buildings.

While conventional portable building may have advantages when it comes to setup time, these buildings often still require multiple people to set them up and often require special tool or heavy machinery to help assemble heavy exterior walls, for example.

Another drawback of portable buildings, and even permanent buildings, can be accessibility. Specifically, after the initial erection and establishment of a portable or permanent building, it can often be difficult to provide users with ample accessibility into the building to allow large products and/or equipment to be stored or used within the building. For example, if large server mainframes or other significantly large systems, electrical or mechanical, require storage within a building, typical doors or windows would not provide enough clearance. Often, in cases of portable buildings, walls may be removed to provide adequate clearance for such large systems or products. However, removing walls of these portable buildings can be time consuming and require multiple workers or heavy machinery to remove the large sections of wall, necessary to provide the need clearance.

The prior art is thus characterized by several disadvantages that are addressed by the present disclosure. The present disclosure minimizes, and in some aspects eliminates, the above-mentioned failures, and other problems, by utilizing the methods and structural features described herein.

The features and advantages of the present disclosure will be set forth in the description which follows, and in part will be apparent from the description, or may be learned by the practice of the present disclosure without undue experimentation. The features and advantages of the present disclosure may be realized and obtained by means of the instruments and combinations particularly pointed out in the appended claims. Any discussion of documents, acts, materials, devices, articles or the like which has been included in the present specification is not to be taken as an admission that any or all of these matters form part of the prior art base, or were common general knowledge in the field relevant to the present disclosure as it existed before the priority date of each claim of this application.

BRIEF DESCRIPTION OF THE DRAWINGS

The features and advantages of the disclosure will become apparent from a consideration of the subsequent detailed description presented in connection with the accompanying drawings in which:

FIG. 3a is a front view of the embodiment of the wall section of FIG. 1, having only a single wall panel installed;

FIG. 3b is a zoomed-in view of section G of the embodiment shown in FIG. 3a;

FIG. 4a is a cross-sectional side view along the A-A plane of FIG. 3a;

FIG. 4b is a zoomed-in view of section E of the embodiment shown in FIG. 4a;

FIG. 4c is a zoomed-in view of section F of the embodiment shown in FIG. 4a;

FIG. 5 is a perspective view of a single wall panel of the embodiment of the wall section of FIG. 1;

FIG. 6 is a front view of a single wall panel of the embodiment of the wall section of FIG. 1;

FIG. 7 is a top view of a pair of interlocking wall panels of the embodiment of the wall section of FIG. 1.

DETAILED DESCRIPTION

Figure 1:
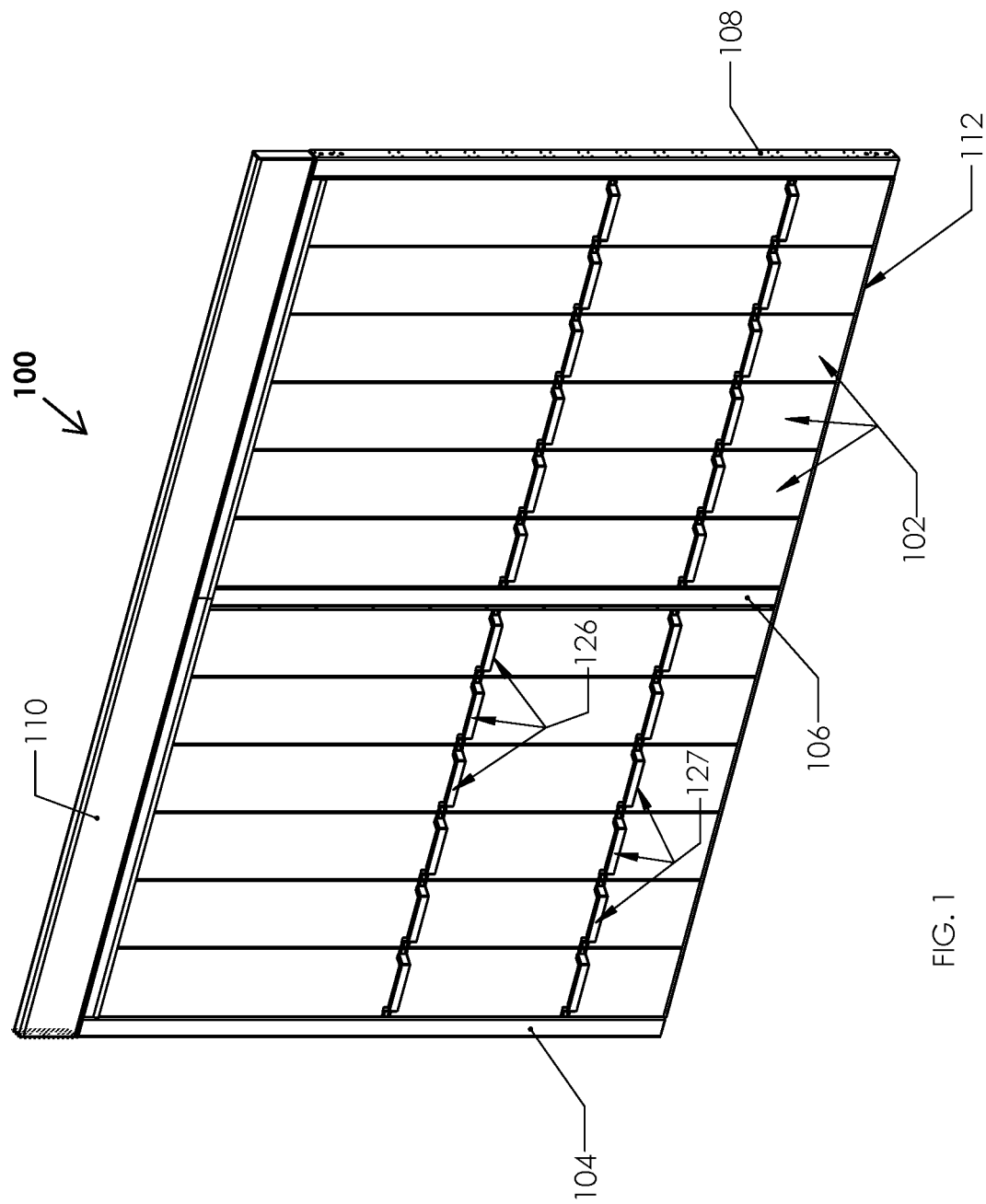
FIG. 1 is a perspective view of an embodiment of a wall section having removable wall panels according to the current disclosure.

For the purposes of promoting an understanding of the principles in accordance with the disclosure, reference will now be made to the embodiments illustrated in the drawings and specific language will be used to describe the same. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure claimed.

It must be noted that, as used in this specification and the appended claims, the singular forms "a," "an," and "the" include plural referents unless the context clearly dictates otherwise.

In describing and claiming the present disclosure, the following terminology will be used in accordance with the definitions set out below.

As used herein, the terms "comprising," "including," "containing," "characterized by," and grammatical equivalents thereof are inclusive or open-ended terms that do not exclude additional, unrecited elements or method steps.

As used herein, the phrase "consisting of" and grammatical equivalents thereof exclude any element, step, or ingredient not specified in the claim.

As used herein, the phrase "consisting essentially of" and grammatical equivalents thereof limit the scope of a claim to the specified materials or steps and those that do not materially affect the basic and novel characteristic or characteristics of the claimed disclosure.

As used herein, the phrase "portable building" and grammatical equivalents thereof is defined as a building or shelter that is not permanent to a specific location and is designed to be moved or transferred to alternate locations without destroying portions of the portable building or foundation.

As used herein, the term "handle" and grammatical equivalents thereof is defined as element or mechanism that is secured to an object as a means of manipulating the position of the object; and a "handle" may be fixed to, removable or integrated with the object.

Referring now to FIGS. 1-4c, a wall section 100 is shown as a structural component of a portable building or enclosure (not shown), for example an electrical building housing electrical system and components. The wall section 100 can provide sufficient structural support to the portable building, such that the wall section 100 can support a roof and or ceiling (not shown), without the need for additional structural support beams, frames, or other structural building components.

Figure 2:
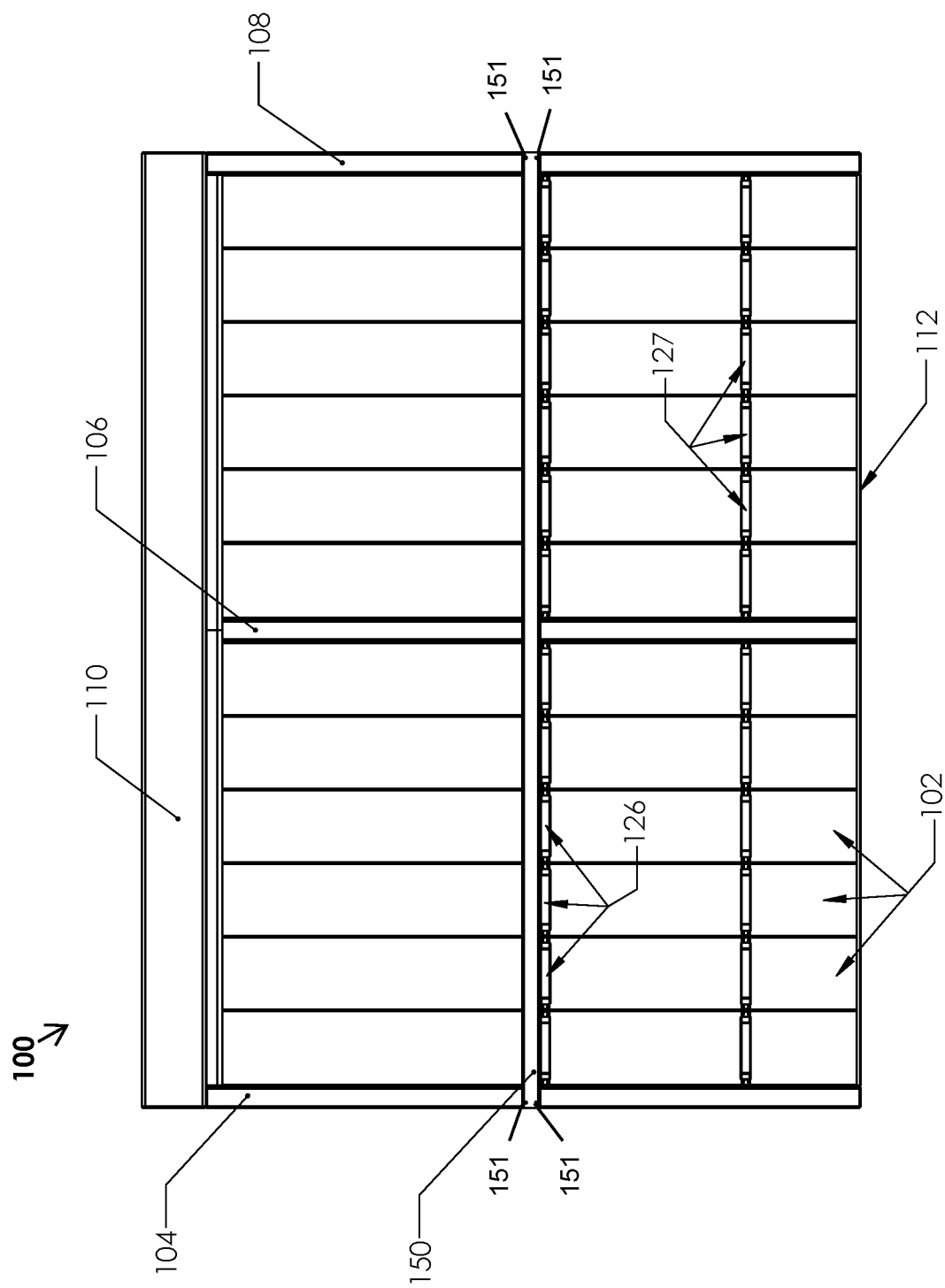
FIG. 2 is a front view of the embodiment of the wall section of FIG. 1.

The wall section 100 is formed from a plurality of removable wall panels 102 spanning a free space, or free span, 105 (shown in FIG. 3a) between load bearing, upwardly extending, support members 104, 106 and 108, or vertical support members. The free space 105 can be defined as the space between upwardly extending support members, absent any window frames, door frames or other structural components that may conventionally provide additional building support to a wall section. For example, removal of all of the wall panels 102 would provide an large open span, or free span, between support members 104, 106 and 108. When all of the wall panels 102 of the wall section 100 are installed, the free space 105 is sealed closed, and a continuous wall structure, absent any openings, is formed, as shown in FIGS. 1 and 2. The free span 105 can extend any desired length, including 10'-20' wide. The upper limits of the size of the free span 105 are limited to the structural strength of the corresponding upwardly extending support members, such as 104, 106 and 108, and the header 110, which together, provide the structural integrity of the portable building, including an roof or ceiling components. The wall panels 102, do not provide vertical strength to the portable building.

The wall section 100 includes a header 110 which runs substantially linearly above the wall panels 102, with the header being supported by the upwardly extending support members 104, 106 and 108, such that the header can be supported structurally, by the upwardly extending support members 104, 106 and 108, alone, although the wall panels 102 can provide additional structural support after installation into the wall section 100.

The wall section 100 also includes a floor beam 112 which runs substantially linearly below the wall panels 102, with the floor beam 112 being positioned flush onto a foundation (not shown) or ground, thereby providing foundational support to the upwardly extending support members 104, 106 and 108, such that the floor beam 112 can structurally support the upwardly extending support members 104, 106 and 108, in the absence of any installed wall panels 102.

Figure 4B:
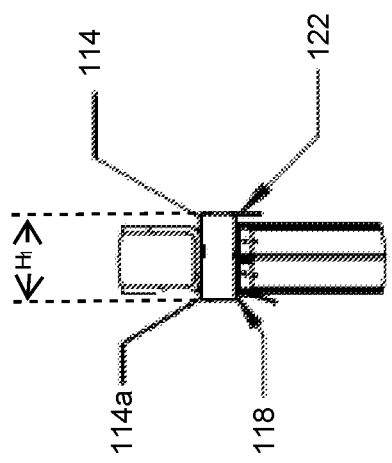
Figure 4C:
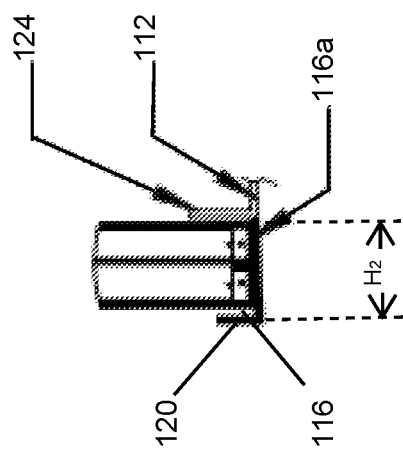
Figure 4A:
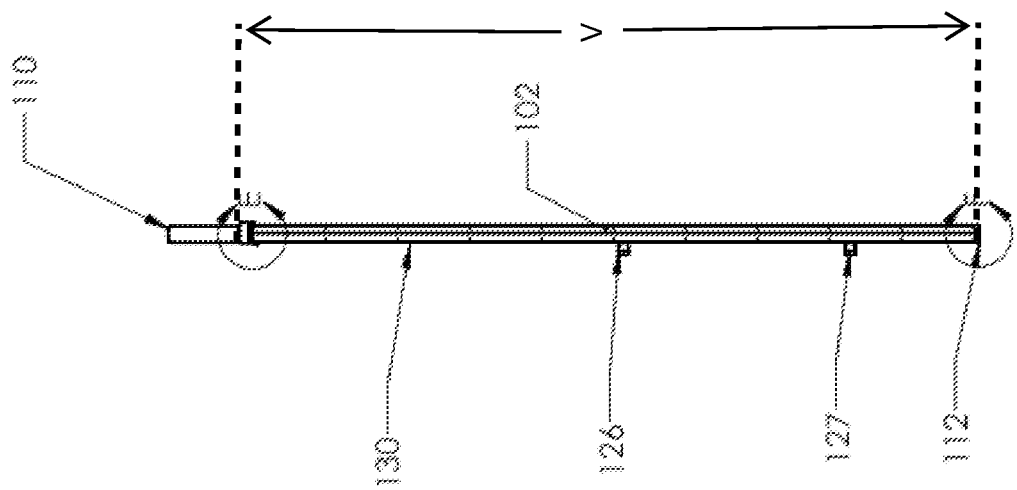

Each wall panel 102 can be installed between and slidably engaged with the header 110 and a floor beam 112, with each wall panel 102 being received within a corresponding channel 114 in the header 110 and a corresponding channel 116 in the floor beam 112. The channels 114 and 116, as shown in FIGS. 4a-4c, each include a front rim 118 and 120, respectively, and a back rim 122 and 124, respectively. The front rims 118 and 120 being immediately adjacent to an exterior surface 130 of the wall panels 102. The header channel 114 forming a substantially C-shape, having a pair of interior corners formed by the intersection of the front rim 118 and the back rim 122 with a substantially planar top surface 114a of the header channel 114. The interior corners may be squared, or alternatively, the intersection of the front rim 118 and the back rim 122 with the substantially planar top surface 114a may be rounded. The substantially planar top surface 114a configured to provide a flush contact surface with a top surface 102a of the wall panels 102.

The floor beam channel 116 can form a substantially J-shape or c-shape, having a pair of interior corners formed by the intersection of the front rim 120 and the back rim 124 with a substantially planar bottom surface 116a of the floor beam channel 116. The interior corners may be squared, or alternatively, the intersection of the front rim 120 and the back rim 124 with the substantially planar bottom surface 116a, may be rounded. Therefore, the floor beam channel 116 and the header channel 114 may form opposing c-shaped channels. The substantially planar bottom surface 116a configured to provide a flush contact surface with a bottom surface 102b of the wall panels 102. The substantially planar bottom surface 116a enables the wall panels 102 to slide horizontally within the floor beam channel 116, after the wall panels 102 have been installed into the header 110 and the floor beam 112. In this embodiment, wall panels 102 can slide horizontally within the header 110 and floor beam 112 without the need of rollers or other mechanical features to facilitate the sliding action.

A horizontal distance H between the front rims 118 and 120 and the back rims 122 and 124, respectively, provides enough clearance for the width of the wall panels 102 to slide horizontally, in a substantially parallel direction along the header 110 and the floor beam 112 without binding. However, the horizontal distance H between the front rims 118 and 120 and the back rims 122 and 124, respectively, is sufficiently small that the channels 114 and 116 can support and retain the substantially vertical positioning of the wall panels between the header 110 and the floor beam 112 and within the channels 114 and 116. The vertical distance D between the header channel 114 and the floor beam channel 116 is greater than the height of the wall panels 102, such that a top edge 102a of the wall panel 102, when installed, can be first inserted into the header channel 114, such that an entire top end of the wall panel is retained within the header channel 114, and then the bottom edge 102b of the wall panel 102 can clear the front rim 120 of the floor beam channel 116, before settling into the floor beam channel 116, such that an entire bottom end of the wall panel 102 is retained within the floor beam channel 116. Once the wall panel 102 has been installed into the header 110 and settled into the floor beam channel 116, the header channel 114 and the floor beam channel 116 will maintain and support the vertical position of each installed wall panel 102, while still enabling each wall panel to slide horizontally into a desired position in the wall section 100.

As shown in FIG. 2, the wall section 100 may include a compression bar 150 which can be secured to upwardly extending support members 104, 106 and/or 106, such that the compression bar 150 can apply a compression pressure against the wall panels 102, thereby adding additional securement of wall panels 102 in place. The compression bar 150 can extend substantially horizontally over the wall panels 102, substantially parallel with the header 110 and the floor beam 112. In other embodiments the compression bar 150 may instead extend in a diagonal direction, or non-horizontal direction, across the wall panels 102. The compression bar 150 may me secured to the upwardly extending support members 104, 106, and or 108, via fasteners 151, such as bolts or screws, for example, such that a user a releasably secure the compression bar 150 in place.

A single user or installer can install and position each wall panel 102, as described above, without the need or help of tools or another installer. To help a single user to install the wall panels 102, each wall panel 102 can include at least one handle 126, and can also include a second handle 127. These handles 126 and 127 can be connected, integrated with, or fixed to the exterior surface 130 of each of the wall panels 102. These handles 126 and 127, may be of any known shape or form that may allow a user to grip the handles 126 and 127 and manipulate the position of the wall panel 102, using a users hands, without the need for a tool. In other embodiments, handles requiring specialized tools may also be used to manipulate the wall panels 102.

As shown in FIGS. 5-7, each wall panel 102 includes stepped side surfaces 103a and 103b. Each stepped side surface 103a and 103b is configured to engage or interlock, forming an interlocking stepped engagement, with the immediately adjacent and corresponding side surfaces 103a and 103b of immediately adjacent wall panels 102, forming a flush continuous exterior wall surface, formed from the exterior surfaces 130 of each wall panel 102. A user can install each wall panel 102 into the header 110 and floor beam 112, as discussed above, and then the user can slide each wall panel 102 into interlocking engagement with each adjacent wall panel 102 until the space between upwardly extending support members 104 and 106, or 106 and 108, is completely sealed with wall panels 104. Once an interlocking engagement between adjacent wall panels is formed, fasteners can be used to removably secure adjacent panels to one another. As shown in FIG. 5, each side surface 103 and 103b or each wall panel 102 can include a plurality of holes 105, or a single hole 105 if desired, that match with corresponding holes 105 of adjacent wall panels 102, such that when adjacent wall panels 102 an interlockingly engaged, a user can secure the panels together using fasteners through holes 105. Securing adjacent wall panels 102 using fasteners in this manner can add structural strength to the wall section 100, as wells as maintain the easy removability of the wall panels 102, by simply removing the fasteners and disengaging the wall panels 102 from each other and from the header 110 and floor beam 112.

The wall panels 102 may include corner panels which are wall panels 102 that are immediately adjacent to at least one upwardly extending support member 104, 106 or 108, and interior panels, which are wall panels 102 that are only immediately adjacent other wall panels 102. Therefore, in an embodiment of the current disclosure, each of the plurality of the interior panels is removably retained within the header channel 118 and the floor beam channel 120, such that each of the interior panels is either not fixedly attached to anything, or is only fixedly attached to an adjacent interior panel or corner panel. "Fixedly attached," and grammatical equivalents, meaning at least two or more members secured together such that independent movement of the members is not possible until the fixed attachment is removed or broken.

The interlocking side surfaces 103a and 103b of adjacent wall panels 102 form a seal from the outside elements. More specifically, the interlocking stepped engagement eliminates a linear seam between adjacent wall panels 102, thereby eliminating, or significantly reducing, the likelihood that outside precipitation will enter the interior of the wall section 100, or corresponding building structure.

The seal between adjacent wall panels 102 can also be improved with the use of gaskets 134a and 134b which are secured to or otherwise connected to the corresponding side surfaces 103a and 103b of the wall panels. These gaskets 134a and 134b can be made of foam, rubber, plastic or other desired weather proofing material which can be compressed between adjacent wall panels 102 as the wall panels are installed and slid into interlocking engagement with one another. The gaskets 134a and 134b can be, for example ⅜" thick to maintain a sufficient weather-proof seal, while maintaining the structural integrity of the wall section 100. In other embodiments, the gaskets 134a and 134b may be ⅛" to ⅝" thick, or the gaskets 134a and 134b may be thinner or thicker as desired.

In at least one embodiment of the present disclosure, even after the wall section 100 has been fully assembled, having each of the wall panels 102 installed and positioned such that the wall panels 102 span an entire distance between upwardly extending support members 104, 106 and/or 106, each and every wall panel 102 remains removably retained within the header channel 118 and the floor beam channel 116, such that each of the plurality of wall panels 102 also remains slidable, if only slightly, along the floor beam 112 and the header 110, while retained within the header channel 118 and the floor beam channel 120.

In addition to the interlocking stepped engagement between adjacent wall panels 102 and the corresponding gaskets 134a and 134b, the wall section 100 may also include a drainage system used to drain precipitation away from the corresponding building structured and away from the exterior surfaces 130 of the wall panels 102. This drain system, as shown in FIGS. 3a and 3b, includes a plurality of weep holes or openings 140 in the front rim 120 of the floor beam 112 immediately adjacent to the bottom surface 116 of the floor beam channel 116.

The openings 140 can be provided at intermittent locations along the entire length of the floor beam 112. As water, condensation or precipitation hits or accumulates on the exterior surface of the wall panels 102, the condensation will run down the wall panels 102 and accumulate into the floor beam channel 116 and then drain out the corresponding openings 140, or holes, thus preventing unwanted buildup of water within the floor beam channel 112. As shown in FIGS. 3a and 3b, the back rim 124 has a substantially greater height than the front rim 120, which also prevents, or significantly reduces, the likelihood that water could buildup within the floor beam channel 112 such that water could overflow over the back rim 124 and into the interior of the wall section and corresponding building.

Figure 8:
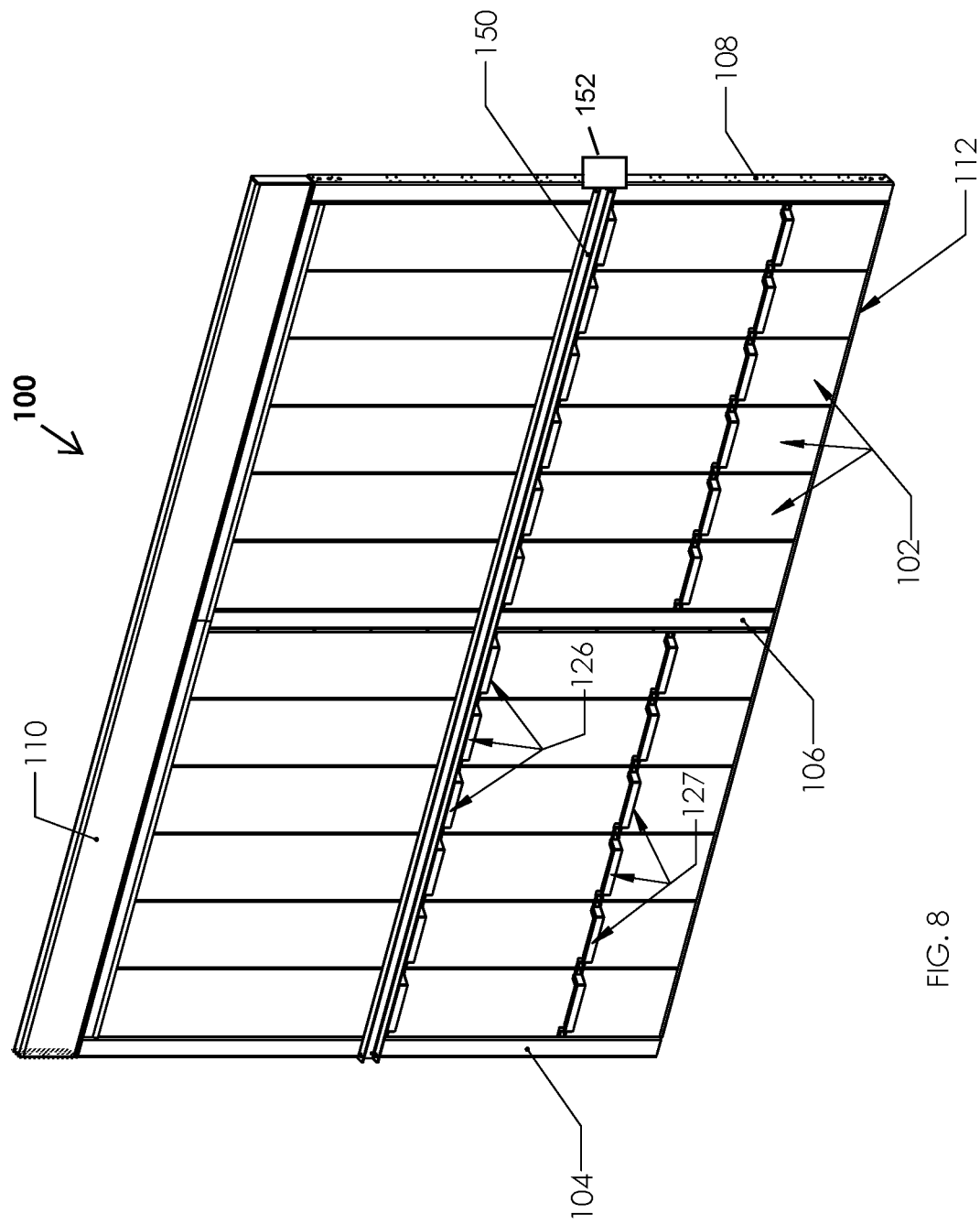
FIG. 8 is another embodiment a wall section having removable wall panels and a compression bar, according to the current disclosure.

Referring to FIG. 8, in another embodiment the wall section 100 may include a compression bar 150 which can be secured to upwardly extending support members 104, 106 and/or 106, such that the compression bar 150 can apply a compression pressure against the wall panels 102, thereby adding additional securement of wall panels 102 in place. The compression bar can extend substantially horizontally over the wall panels 102, substantially parallel with the header 110 and the floor beam 112. In other embodiments the compression bar 150 may instead extend in a diagonal direction, or non-horizontal direction, across the wall panels 102. The compression bar may also include a locking mechanism 152, wherein a user can secure the compression bar 150 to the upwardly extending support members 104, 106 and/or 108 and then lock the compression bar 150 in place. The locking mechanism 152 can be used to deter theft, vandalism, or unwanted manipulation of the wall panels 102, additional an additional level of security to the corresponding building.

In another embodiment, an entire wall space of a portable building can consist of only the disclosed wall section 100, such that all of the wall panels can be removed, leaving a large free span, or opening having no window frames, door frames, or additional supporting structure beyond the disclosed wall section 100. This large free span can enable a user to move large equipment or products into the corresponding portable building, which would not fit through conventional door or windows.

The wall panels 102 may be made of metal, such as aluminum, for example, composite material or another desired material, having a weight that enables a single user to manipulate and position a wall panel 102. For example, each wall panel 102 may be less than 50 lbs. to satisfy conventional safety standards, restricting the maximum lifting weight by a single person. The upwardly extending support members 104, 106 and 108, along with the header 110 and the floor beam 112, may also be formed of metal, for example, steel, to provide need structural strength of the corresponding portable building. The upwardly extending support members 104, 106 and 108, along with the header 110 and the floor beam 112, may also be formed of composite material or another desired material.

Each wall panel 102 may be 12" across the exterior surface in the horizontal direction, and may be 10'-12' tall in the vertical direction, although the wall panels 102 can be formed having smaller or larger dimensions, depending on specific need and desires of a user. Each wall panel 102 may also be independently insulated, using foam insulation, fiberglass or other desired insulation material. Insulation may be positioned within the wall panels 102, so may be affixed to an interior surface of the wall panels. The independently insulated wall panels 102 can provide a continuous R, or insulation, rating, particularly due to the absence of windows or doors in the wall section 100.

Those having ordinary skill in the relevant art will appreciate the advantages provide by the features of the present disclosure. For example, it is a feature of the present disclosure to provide a portable building having removable wall panels that can be installed and/or removed by a single worker, without the need to tools or equipment. Another feature of the present disclosure to provide such a removable wall panel system while also sealing and protecting against outside elements, including rain and precipitation. It is a further feature of the present disclosure, in accordance with one aspect thereof, to provide a removable wall panel system that can provide easy access to a large free span or unencumbered opening, while maintaining the structural integrity of the surrounding building.

In the foregoing Detailed Description, various features of the present disclosure are grouped together in a single embodiment for the purpose of streamlining the disclosure. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment. Thus, the following claims are hereby incorporated into this Detailed Description of the Disclosure by this reference, with each claim standing on its own as a separate embodiment of the present disclosure.

It is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been shown in the drawings and described above with particularity and detail, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A portable building having a wall section comprising:
    a first upwardly extending support member and a second upwardly extending support member;
    a header supported by the first upwardly extending support member and the second upwardly extending support member, wherein the header includes a header channel;
    a floor beam secured to the first upwardly extending support member and the second upwardly extending support member, wherein the floor beam includes a floor beam channel, and the header channel and the floor beam channel form opposing C-shaped channels;
    a plurality of wall panels, wherein each of the plurality of wall panels is removably retained within the header channel and the floor beam channel, such that each of the plurality of wall panels is slidable along the floor beam and the header while retained within the header channel and the floor beam channel;
    wherein the each of the plurality of wall panels are configured to interlockingly engage an immediately adjacent wall panel, of said plurality of wall panels, and an exterior surface of each of the plurality of wall panels form a continuous exterior wall surface, and each of the plurality of wall panels is independently insulated, includes at least one handle connected to the exterior surface of the wall panel, and includes a stepped side surface which is configured to interlockingly engage with the stepped surface of an adjacent wall panel, of said plurality of wall panels, the side surface of each of the plurality of wall panels having a gasket secured thereon;
    wherein each of the plurality of wall panels are secured together with fasteners;
    a compression bar extends from and is secured to the first upwardly extending support member and the second upwardly extending support member, the compression bar contacting the exterior surface of each of the plurality of wall panels, wherein the compression bar is locked in place by a locking mechanism;
    wherein the floor beam channel includes a front rim and a back rim, the back rim having a greater height than the front rim, and the front rim having at least one hole, enabling condensation to be drained out through the hole;
    wherein at least one of the plurality of wall panels includes an exterior side surface which also forms an exterior side surface of the portable building, and at least one of the plurality of wall panels is characterized by an absence of a roller to facilitate sliding of the at least one of the plurality of wall panels into a desired position;

wherein an entire top end of each of the plurality of wall panels are retained within the header channel and an entire bottom end of each of the plurality of wall panels are retained within the floor beam channel;

wherein when the wall section is fully assembled, each and every one of the plurality of wall panels is removably retained within the header channel and the floor beam channel, and each of the plurality of wall panels is slidable along the floor beam and the header while retained within the header channel and the floor beam channel; and wherein each of the plurality of wall panels are configured to interlockingly engage an immediately adjacent wall panel, of said plurality of wall panels, after being retained by the header channel and the floor beam channel.

* * * * *